United States Patent
Savin et al.

(10) Patent No.: US 12,273,200 B2
(45) Date of Patent: Apr. 8, 2025

(54) METHODS AND DEVICES FOR TRANSMITTING AND RECEIVING NON-BINARY ERROR CORRECTING CODE WORDS

(71) Applicants: Commissariat à l'énergie atomique et aux énergies alternatives, Paris (FR); UNIVERSITE DE BRETAGNE SUD, Lorient (FR)

(72) Inventors: Valentin Savin, Grenoble (FR); Emmanuel Boutillon, Lorient (FR)

(73) Assignees: Commissariat à l'énergie atomique et aux énergies alternatives, Paris (FR); UNIVERSITE DE BRETAGNE SUD, Lorient (FR)

( * ) Notice: Subject to any disclaimer, the term of this patent is extended or adjusted under 35 U.S.C. 154(b) by 0 days.

(21) Appl. No.: 18/068,112

(22) Filed: Dec. 19, 2022

(65) Prior Publication Data

US 2023/0208560 A1 Jun. 29, 2023

(30) Foreign Application Priority Data

Dec. 23, 2021 (FR) ...................................... 21 14346

(51) Int. Cl.
*H04L 1/1607* (2023.01)
*H04L 1/00* (2006.01)

(52) U.S. Cl.
CPC .......... *H04L 1/1621* (2013.01); *H04L 1/0003* (2013.01)

(58) Field of Classification Search
CPC ..... H04L 1/1621; H04L 1/0003; H04L 27/02; H04L 1/0057; H04L 27/10; H04L 1/0041;
(Continued)

(56) References Cited

U.S. PATENT DOCUMENTS 9,438,305 B2 * 9/2016 Boutillon ............ H04J 13/0074
10,581,556 B1 * 3/2020 Dizdar .................. H04L 1/0625
(Continued)

OTHER PUBLICATIONS

French Preliminary Search Report issued Aug. 10, 2022 in French Application 21 14346, filed on Dec. 23, 2021 (with English Translation of Categories of cited documents), 3 pages.
(Continued)

*Primary Examiner* — Albert Decady
*Assistant Examiner* — Osman M Alshack
(74) *Attorney, Agent, or Firm* — Oblon, McClelland, Maier & Neustadt, L.L.P.

(57) ABSTRACT

The invention relates to the transmission and reception of non-binary error correcting code words. The transmission method includes a first modulation (56) which implements a set of q sequences comprising q−1 sequences of q−1 chips, each sequence being obtained by circular shifting of a basic pseudo-random sequence, and a partially invariant sequence, invariant to a predetermined subset of circular shifts. The first modulation (56) further implements an association between each code word symbol and a sequence of the set of sequences wherein said finite field $GF_q$ has a non-zero primitive element, the symbol zero being associated with said partially invariant sequence and a symbol equal to a power j of the primitive element, j being an integer comprised between 0 and q−2, being associated with a pseudo-random sequence determined by j circular shifts of the basic pseudo-random sequence.

15 Claims, 6 Drawing Sheets

(58) Field of Classification Search
CPC .. H03M 13/134; H03M 13/251; H03M 13/33; H04J 11/00; H04J 13/00
USPC ................................................ 714/752, 776
See application file for complete search history.

(56) References Cited

U.S. PATENT DOCUMENTS

| | | | | |
|---|---|---|---|---|
| 2010/0310009 | A1* | 12/2010 | Lakkis | H04L 27/2003 375/308 |
| 2011/0072330 | A1* | 3/2011 | Kolze | H03M 13/2732 714/E11.03 |
| 2013/0129020 | A1* | 5/2013 | Lakkis | H04J 13/0014 375/308 |
| 2015/0003499 | A1* | 1/2015 | Boutillon | H04L 27/2003 375/146 |
| 2015/0078487 | A1* | 3/2015 | Lakkis | H04J 13/0014 375/308 |
| 2015/0215064 | A1* | 7/2015 | Quick, Jr. | H04L 25/0204 370/210 |
| 2021/0167799 | A1* | 6/2021 | Boutillon | H03M 13/1171 |
| 2021/0250047 | A1* | 8/2021 | Boutillon | H03M 13/6591 |
| 2022/0038116 | A1* | 2/2022 | Harb | H03M 13/1111 |

OTHER PUBLICATIONS

Saied, K. et al. "Time-Synchronization of CCSK Short Frames" 2021 17$^{th}$ International Conference on Wireless and Mobile Computing, Networking and Communications (WIMOB) (Oct. 11, 2021) 6 pages.

Savin, V. et al. "Non-Binary Polar Codes for Spread-Spectrum Modulations" 2021 11$^{th}$ International Symposium on Topics in Coding (Aug. 30, 2021) 5 pages.

* cited by examiner

METHODS AND DEVICES FOR TRANSMITTING AND RECEIVING NON-BINARY ERROR CORRECTING CODE WORDS

This application claims priority to French Patent Application No. FR 21 14346 filed Dec. 23, 2021, the entire disclosure of which is incorporated by reference herein.

FIELD OF THE INVENTION

The present invention relates to methods of transmitting and receiving non-binary error correcting code words and associated devices.

The invention relates to data communication via a transmission channel which introduces an unknown delay and/or noise.

The invention finds applications in massive data transmissions of low exploitable data density, e.g. in the context of massive IoT communication.

BACKGROUND OF THE INVENTION

Conventionally, in the field of asynchronous communication systems, when a transmission channel adds an unknown delay, in order to ensure synchronization at the receiver level, it is known how to introduce synchronization headers into the communication frames. Moreover, to ensure a correct decoding in the presence of noise, it is also known how to use error correcting codes.

Synchronization by adding synchronization headers introduces an increase in the amount of data to be transmitted, for the same exploitable data density, which consumes both spectral resources and power during transmission. Such an overload in terms of the amount of data to be transmitted is not acceptable.

Communication systems are also known wherein synchronization sequences are superimposed on communication frames, instead of being transmitted in headers. Such superposition increases the energy consumed during transmission. Moreover, at the receiver, separate operations of synchronization and then decoding are to be implemented, which increases the complexity of the receivers.

In order to make synchronization possible in the context of asynchronous communications, it is desirable to simplify the decoding while limiting the quantity of data to be transmitted.

Furthermore, it is known how to use a cyclic code-shift keying (CCSK) modulation for spreading the spectrum of a transmitted signal, in order to obtain better robustness against noise.

The goal of the invention is to meet such requirement by proposing a modification of a cyclic code-shift key, which advantageously makes it possible to detect the presence of a message, and according to particular embodiments, to jointly synchronize and perform the error correcting decoding after reception.

SUMMARY OF THE INVENTION

To this end, the invention proposes, according to one aspect, a method for transmitting symbols of non-binary error correcting code words through a transmission channel, each code word symbol comprising p bits and being part of a finite field $GF_q$ with $q=2^p$ elements, the process including:
 a first spread spectrum modulation associating a sequence of chips with each p-bit code word symbol,
 a second modulation for modulating at least one carrier with the sequences associated with the code words, by phase or amplitude modulation, allowing at least one modulated carrier to be obtained,
 a transmission of said at least one modulated carrier forming a signal through said transmission channel.

The method is such that the first modulation implements a set of q sequences comprising q−1 sequences of q−1 chips, each sequence being obtained by circular shifting of a basic pseudo-random sequence, and a partially invariant sequence, consisting of q−1 chips and invariant to a predetermined subset of circular shifts. The first modulation further implements an association between each code word symbol and a sequence of the set of sequences wherein, said finite field $GF_q$ having a non-zero primitive element, the symbol zero is associated with said partially invariant sequence and a symbol equal to a power j of the primitive element, j being an integer comprised between 0 and q−2, being associated with a pseudo-random sequence determined by j circular shifts of the basic pseudo-random sequence.

The method for transmitting non-binary correcting code word symbols through a transmission channel according to the invention can further have one or a plurality of the features hereinafter, taken independently or according to all technically feasible combinations.

The partially invariant sequence is a constant sequence consisting of q−1 chips with the same value.

Prior to the application of a non-binary error correcting code, the method further includes the formation of a message of K symbols of $GF_q$, to which the non-binary error correcting coding is applied so as to generate a code word, the message being formed in such a way that a symbol called an anchoring symbol, with a value belonging to a predetermined subset of $GF_q$, is placed at a predetermined position in the message or in said code word.

The predetermined subset of $GF_q$ comprises a single predetermined non-zero value, and the anchoring symbol takes said predetermined non-zero value.

During the step of message formation, said anchoring symbol is placed at said predetermined position in the message.

The formation of the message comprises a determination of a symbol of said message as a function of K−1 other symbols of the message, the code word obtained after encoding comprising said anchoring symbol at said predetermined position.

The first modulation includes a generation, by a maximum length linear feedback shift register, of the basic pseudo-random sequence.

The second modulation is a phase or amplitude modulation of the carrier.

The second modulation used for the partially invariant sequence is different from the second modulation used by the sequences obtained by circular shifting of the basic pseudo-random sequence.

The second modulation includes an absence of carrier wave for the partially invariant sequence and a phase modulation for the sequences obtained by circular shifting of the basic pseudo-random sequence.

According to another aspect, the invention relates to a method of receiving a received signal, the received signal being transmitted by a transmission method as briefly described hereinabove, the transmitted signal including transmitted error correcting code word symbols. Such reception method includes the steps of:

demodulating the received signal, making it possible to obtain an estimation of the coded symbols transmitted from the received signal, a joint decoding and synchronization, comprising:

a decoding for determining a decoded word and/or a corresponding decoded message from the estimations of the coded symbols, as provided by the demodulation step, said decoded word providing an estimation of the transmitted code word multiplied by the primitive element of the finite field $GF_q$ raised to a power equal to a synchronization shift, an estimation of said synchronization shift starting from an anchoring symbol at a predetermined position in the decoded word or in the corresponding decoded message.

The reception method according to the invention can further have one or a plurality of the features below, taken independently or according to all technically feasible combinations.

The reception method further comprises an estimation of the transmitted code word by dividing the symbols of the decoded word and/or of the decoded message by the primitive element of the finite field raised to the power equal to the estimated synchronization shift.

When the estimation of the transmitted code word does cannot be used for obtaining a code word, the reception method further comprises a synchronization by applying the estimated synchronization shift and an iteration of the decoding steps, and of the estimation of the synchronization shift until a stop criterion is satisfied.

The steps of demodulation and joint decoding and synchronization are repeated periodically, shifting the received signal by a predetermined number of chips.

According to another aspect, the invention relates to a device for transmitting non-binary error correcting code word symbols through a transmission channel, each code word symbol comprising p bits and being part of a finite field $GF_q$ with $q=2^p$ elements. The transmission device is configured for implementing:

a first spread spectrum modulation module associating a sequence of chips with each p-bit code word symbol, a second modulation module configured for modulating at least one carrier with the sequences associated with the code words, by phase or amplitude modulation, which can be used for obtaining at least one modulated carrier, a module for transmitting said at least one modulated carrier forming a signal, through said transmission channel.

The transmission device is such that the first modulation module is configured for implementing a set of q sequences comprising q−1 sequences of q−1 chips, each sequence being obtained by circular shifting of a basic pseudo-random sequence ($R_0$), and a partially invariant sequence, consisting of q−1 chips and invariant to a predetermined subset of circular shifts. The first modulation module is further configured for implementing an association between each code word symbol and a sequence of the set of sequences wherein, said finite field $GF_q$ having a non-zero primitive element, the symbol zero is associated with the partially invariant sequence and a symbol equal to a power j of the primitive element, j being an integer comprised between 0 and q−2, being associated with a pseudo-random sequence determined by j circular shifts of the basic pseudo-random sequence.

The transmission device is configured for implementing all the steps of the transmission method briefly described hereinabove, according to all the variants of implementation thereof.

According to another aspect, the invention relates to a device for receiving a received signal, said received signal coming from a signal transmitted by a transmission device as briefly described hereinabove, said transmitted signal including transmitted error correcting code word symbols. The reception device is configured for implementing:

a module for demodulating the received signal, which can be used for obtaining an estimation of the coded symbols transmitted from the received signal, a joint decoding and synchronization module, comprising:

a decoding module for determining a decoded word and/or a corresponding decoded message from the estimations of the coded symbols, as provided by the demodulation step, said decoded word providing an estimation of the transmitted code word multiplied by the primitive element of the finite field $GF_q$ raised to a power equal to a synchronization shift, a module for estimating said synchronization shift from an anchoring symbol at a predetermined position in the decoded word or in the corresponding decoded message.

The reception device is configured for implementing all the steps of the reception method briefly described hereinabove, according to all the variants of implementation thereof.

BRIEF DESCRIPTION OF THE DRAWINGS

Other features and advantages of the invention will be clear from the description thereof which is given below as a non-limiting example, with reference to the enclosed figures, among which.

DETAILED DESCRIPTION OF EMBODIMENTS

Figure 1:
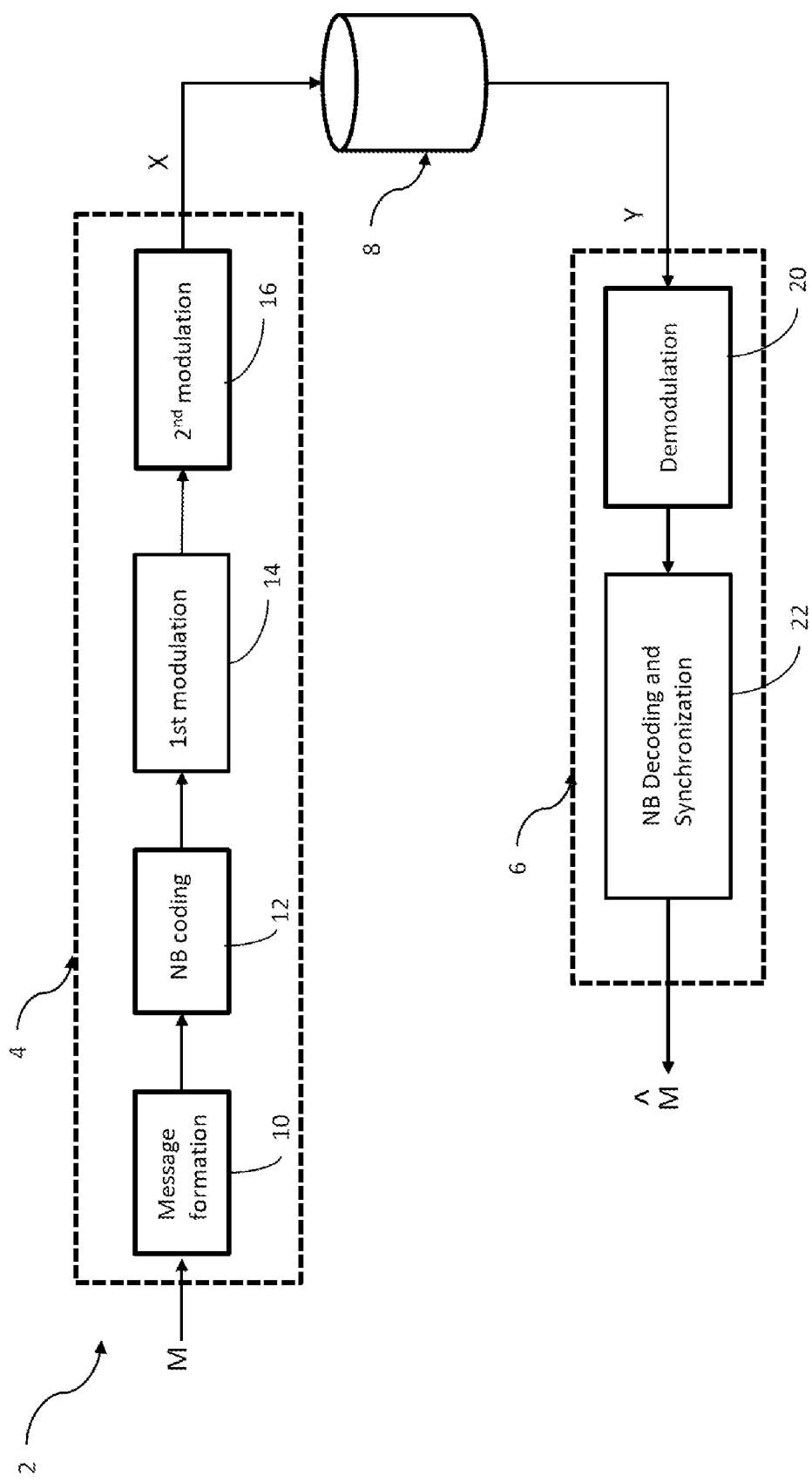
FIG. 1 schematically represents an asynchronous communication system according to one embodiment.

FIG. 1 illustrates an asynchronous communication system 2 suitable for implementing the invention, hereinafter called more simply a communication system.

The communication system 2 includes a transmission device 4 and a reception device 6. A message M is processed and transmitted to the reception device 6, in the form of a signal modulated by carriers and referenced by X, by the transmission device 4, via a transmission channel 8 represented schematically in FIG. 1. The reception device 6 receives and processes a received signal Y, in order to obtain a decoded message M.

The message M contains exploitable data density to be transmitted, in the form of a set of bits called source bits.

The transmission channel 8 adds an unknown delay, hereinafter called synchronization delay, and channel noise.

In the example shown in FIG. 1, the transmission device 4 includes a non-binary encoding module 10, which applies a non-binary linear error correcting coding to the message to be transmitted.

The invention applies to any non-binary and linear error correcting code, e.g. one of the following correcting codes: Low Density Parity Check (LDPC), Reed-Solomon, Turbo-code or polar code.

Such correcting codes are built on a non-binary Galois field with q elements (or with cardinality q), denoted by $GF_q$, q being a power of a prime number, and preferentially a power of 2, e.g. $q=2^p$ so as to represent symbols with p bits.

In a known manner, such a Galois field comprises the zero element 0 and q−1 successive powers of a primitive element α.

In other words, the elements of the field $GF_q$ are defined by:

$$GF_q = \{0, \alpha^0, \alpha^1, \ldots, \alpha^{q-2}\} \quad \text{[MATH 1]}$$

A set of (K−1)×p source bits, corresponding to K−1 source symbols of p bits each, is first supplemented by p known bits, corresponding to a non-zero symbol of $GF_q$, with a known value, also called anchoring symbol, so as to generate a source message of exactly K symbols. The extended message is denoted by:

$$M = (m_1, m_2, \ldots, m_K) \in GF_q^K \quad \text{[MATH 2]}$$

e.g., if the anchoring symbol takes the value $\alpha^0 = 1$ and is placed in the first position of the message M, one obtains:

$$M = (\alpha^0, m_2, \ldots, m_K) \in GF_q^K \quad \text{[MATH 3]}$$

Of course, any other predetermined non-zero value $\alpha^i \neq 0$, and any other predetermined position with j, 1≤j≤K index, can be chosen:

$$M = (m_1, \ldots, m_{j-1}, \alpha^i, m_{j+1}, \ldots, m_K) \in GF_q^K \quad \text{[MATH 4]}$$

For simplicity and without loss of generality, it can thus be assumed that $m_1 \neq 0$ is the anchoring symbol, known both to the transmitter and to the receiver.

In such case, the anchoring symbol takes the value thereof in a predetermined subset of $GF_q$, the subset being reduced to a single predetermined non-zero value.

The extended message with a size of K symbols is then transformed by the error correcting coding into a code word C of N symbols (i.e. N×p coded bits), the number N being greater than the number K.

$$C = (c_1, \ldots, c_N) \in GF_q^N \quad \text{[MATH 5]}$$

If the encoding operation is systematic, i.e. set of K symbols of the message M is integrally found in the code word C at known positions, then the anchoring symbol of predetermined value $m_1$ will be found at a known position of C.

In such case, for simplicity and without loss of generality, it will be assumed that $m_1$ is in the first position in C, i.e. $c_1 = m_1$, which makes it a symbol known both to the transmitter and to the receiver.

It should be noted that if the encoding operation is not systematic, the code word C does not necessarily contain an anchoring symbol of predetermined value.

Nevertheless, in an alternative embodiment, instead of assigning a predetermined value to a symbol of the message M (anchoring symbol in the message), it is possible to assign a predetermined value to a symbol of the code word C.

To this end, it is sufficient to consider the fact that any symbol of the code word C can be expressed as a linear combination of the symbols of the message M. Considering e.g. the first symbol of C:

$$c_1 = h_1 m_1 + h_2 m_2 + \ldots + h_K m_K \quad \text{[MATH 6]}$$

where the coefficients $h_1, h_2, \ldots, h_K \in GF_q$, with at least one non-zero coefficient, and the multiplication and addition operations in the above formula, are performed in $GF_q$.

Thus, assuming without loss of generality that $h_1 \neq 0$, it is possible to assign a predetermined value to the symbol $c_1$, e.g. $c_1 = \alpha^0$, simply by determining the value of the symbol $m_1$ from the values of the symbols $m_2, \ldots, m_K$ by the formula:

$$m_1 = h_1^{-1}(\alpha^0 - h_2 m_2 \ldots - h_K m_K) \quad \text{[MATH 7]}$$

Thus $c_1 = \alpha^0$ is obtained, which makes same an anchoring symbol of predetermined value, known both to the transmitter and to the receiver.

The present invention applies to the two embodiments hereinabove: both for the first embodiment when the anchoring symbol is a symbol of the message M, and for the second embodiment when the anchoring symbol is a symbol of the code word C. It should be noted, that the two embodiments are obtained by a specific formation of the message M.

The transmission device further includes a first modulation module 14 configured for applying a first modulation and a second modulation module 16 configured for applying a second modulation.

The first modulation applied by the module 14 is spread spectrum modulation. More particularly, the first modulation module 14 implements a modified variant of the CCSK cyclic code-shift keying modulation.

Conventional CCSK modulation consists of associating a sequence of q chips with each symbol of a set of q symbols, numbered from 0 to q−1. The chip sequence space consists of sequences $P_0$ to $P_{q-1}$, where $P_0$ is a pseudo-random sequence consisting of q bits, and each sequence $P_i$ is obtained by circular shifting of j positions, in a predetermined direction, of the sequence $P_0$.

As a numerical example, for q=8 and p=3, table 1 below illustrates the association or mapping between each symbol and each sequence, obtained by circular shifting to the left of a sequence $P_0 = (1,1,1,0,1,0,0,0)$:

TABLE 1

| | |
|---|---|
| 0 | 1 1 1 0 1 0 0 0 |
| 1 | 1 1 0 1 0 0 0 1 |
| 2 | 1 0 1 0 0 0 1 1 |
| 3 | 0 1 0 0 0 1 1 1 |
| 4 | 1 0 0 0 1 1 1 0 |
| 5 | 0 0 0 1 1 1 0 1 |
| 6 | 0 0 1 1 1 0 1 0 |
| 7 | 0 1 1 1 0 1 0 0 |

The direction of the circular shifting is chosen by convention.

The first modulation according to the invention implements a set of q sequences $\{Z, R_0, \ldots, R_{q-2}\}$ comprising q−1 sequences of q−1 chips, each sequence being obtained by circular shifting of a basic pseudo-random sequence $R_0$, and a partially invariant sequence Z, which is, in the present embodiment, a constant sequence (i.e. invariant to any circular shifting in the present case) consisting of q−1 chips of the same value.

Preferentially, the basic pseudo-random sequence $R_0$ is generated by a linear-feedback shift register of maximum length or by a sequence called constant amplitude zero autocorrelation waveform (CAZAC).

Using a mathematical formulation, the basic pseudo-random sequence $R_0$ is written:

$$R_0 = (R_0(0), R_0(1), \ldots, R_0(q-2)) \quad \text{[MATH 8]}$$

where $R_0(i) \in \{0,1\}, \forall i = 0, 1, \ldots, q-2$

The set of sequences $R_1$ to $R_{q-2}$ is defined by circular shifting the sequence $R_0$ in a predetermined direction. Thus, any sequence $R_u$, $\forall u=0, \ldots, q-2$ is written:

$$R_u(i)=R_0(i+u \bmod(q-1)), \forall i=0, \ldots, q-1,  \quad \text{[MATH 9]}$$

The constant sequence Z has q−1 chips of the same values, and is denoted by: $Z=(z, z, \ldots, z)$.

z=0 or z=1 e.g. can be considered. However, z can be also considered as a symbolic value (rather than a numerical value), so as to distinguish same from the chips 0 and 1 which form the sequences $R_0, \ldots, R_{q-2}$. In this way it is possible to distinguish, in the second modulation module 16, between the modulation used for the sequence Z and the modulation used for the sequences $R_0, \ldots, R_{q-2}$.

Advantageously, the constant sequence Z is invariant for any circular shift.

The association of a symbol $GF_q$ with a sequence of the sequence set $\{Z, R_0, R_1, \ldots, R_{q-2}\}$ is defined by a mapping function $\mu()$ defined as follows:

$$\mu(0)=Z$$

$$\mu(\alpha^u)=R_u, \forall k=0, \ldots, q-2  \quad \text{[MATH 10]}$$

Thus, all the symbols $c_u$ of the code word are associated with a sequence of q−1 chips of the set of sequences defined hereinabove.

The $\mu()$ function defines a mapping scheme.

As a numerical example, for q=8 and p=3, table 2 below illustrates the association according to the mapping scheme defined hereinabove, with the base sequence $R_0=(1,1,1,0,1,0,0)$:

TABLE 2

| 0 | z z z z z z z |
|---|---|
| $\alpha^0$ | 1 1 1 0 1 0 0 |
| $\alpha^1$ | 1 1 0 1 0 0 1 |
| $\alpha^2$ | 1 0 1 0 0 1 1 |
| $\alpha^3$ | 0 1 0 0 1 1 1 |
| $\alpha^4$ | 1 0 0 1 1 1 0 |
| $\alpha^5$ | 0 0 1 1 1 0 1 |
| $\alpha^6$ | 0 1 1 1 0 1 0 |

Such association is called $GF_q$-covariant association.

The following property, called the covariance property, is verified for the modified CCSK modulation: when a symbol c of $GF_q$ is associated with the mapping scheme defined by $\mu()$, i.e. $\mu(c)=S$, the sequence S' obtained by a circular shifting of k positions, denoted by $S'=k \circlearrowleft S$, is the sequence of chips associated with $\alpha^k c$. In other words:

$$\mu(\alpha^k c)=k \circlearrowleft S  \quad \text{[MATH 11]}$$

In an equivalent way, by denoting by $\mu^{-1}()$ the inverse association, used for associating a sequence of chips with a symbol, the following relation is verified:

$$\mu^{-1}(k \circlearrowleft S)=\alpha^k c  \quad \text{[MATH 12]}$$

The second modulation, implemented by the second modulation module 16, is a phase modulation or an amplitude modulation, e.g. a BPSK (Binary Phase Shift Keying) modulation or an OOK (On Off Keying) modulation.

In one embodiment, the sequences $R_u$ obtained by a circular shifting of the sequence $R_0$ are modulated using phase modulation, preferentially BPSK phase modulation, and the constant sequence Z is modulated according to a different modulation.

According to a particular embodiment, the second modulation comprises an absence of carrier wave for the constant sequence and a 2-state phase modulation or BPSK (Binary Phase Shift Keying) modulation for the sequences obtained by circular shifting of the basic pseudo-random sequence.

The modulated carriers form an X signal transmitted via the transmission channel.

The reception device 6 includes a demodulation module 20 and a joint decoding and synchronization module 22, the decoding being a non-binary corrector decoding.

Advantageously, in particular by virtue of the application of the first modulation as described above, the receiver device is suitable for jointly performing the error correcting decoding and the synchronization, as will be described in greater detail hereinabove.

Figure 2:
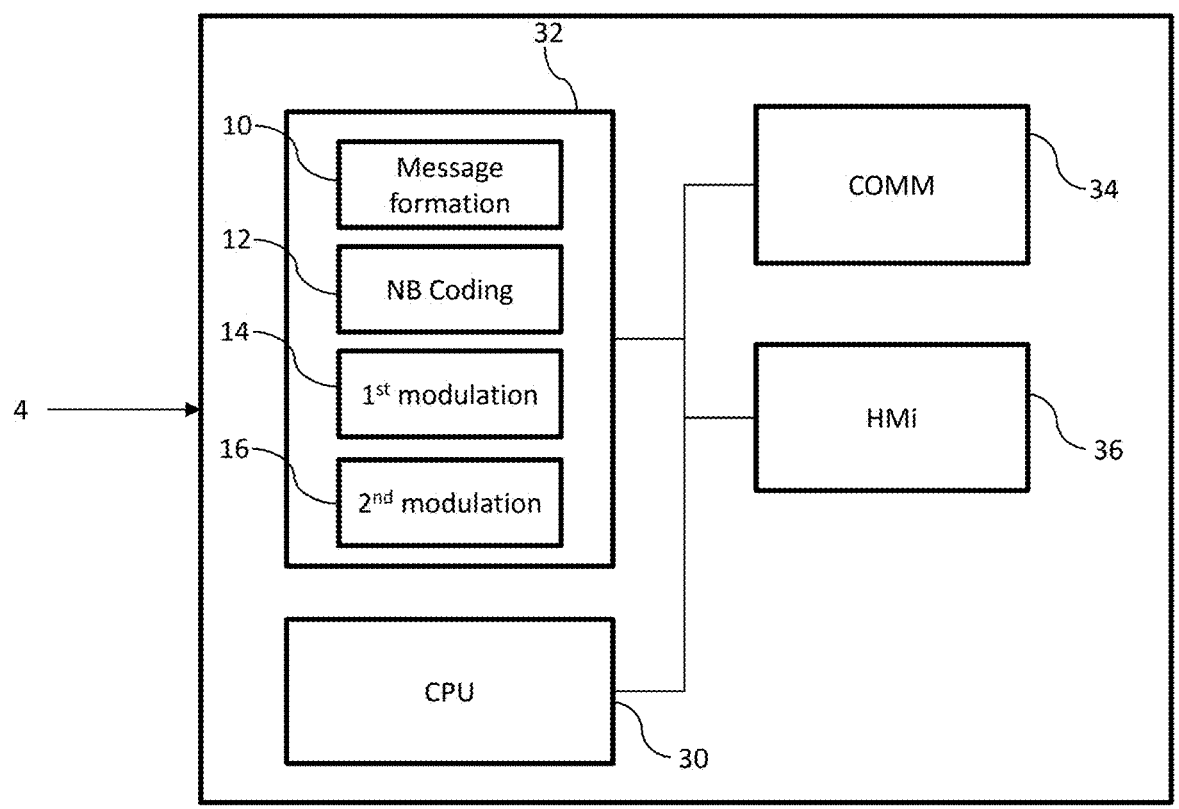
FIG. 2 schematically represents a transmission device according to one embodiment.

FIG. 2 schematically represents a transmission device 4 according to one embodiment. The transmission device 4 is a programmable electronic device, typically a computer, and comprises a central computing unit (CPU) 30, an electronic memory 32, a communication interface 34 and a human-machine interface 36. The elements 30, 32, 34, 36 are suitable for communicating via a communication bus.

The central computing unit 30 comprises one or a plurality of processors apt to execute computer program instructions stored by the electronic memory 32 when the device 4 is powered on.

The electronic memory unit is configured for storing a module 10 for forming a message of K non-binary symbols, a module 12 for non-binary coding, a module 14 for a first modulation and a module 16 for a second modulation.

In one embodiment, the modules 10, 12, 14, 16 are embodied in the form of software code, and form a computer program, including software instructions which, when implemented by the programmable electronic device, implement a method for transmitting non-binary error correcting code symbols according to the invention.

In a variant (not shown), the modules 10, 12, 14, 16 are each embodied in the form of a programmable logic component, such as an FPGA (Field Programmable Gate Array) or a GPGPU (General-purpose processing on graphics processing), or further in the form of a dedicated integrated circuit, such as an ASIC (Application Specific Integrated Circuit).

The computer program implementing the method for transmitting non-binary error correcting code symbols is further apt to be recorded on a computer-readable medium (not shown). The computer-readable medium is e.g. a medium apt to store the electronic instructions and to be coupled to a bus of a computer system. As an example, the readable medium is an optical disk, a magneto-optical disk, a ROM memory, a RAM memory, any type of non-volatile memory (e.g. EPROM, EEPROM, FLASH, NVRAM), a magnetic card or an optical card.

Figure 3:
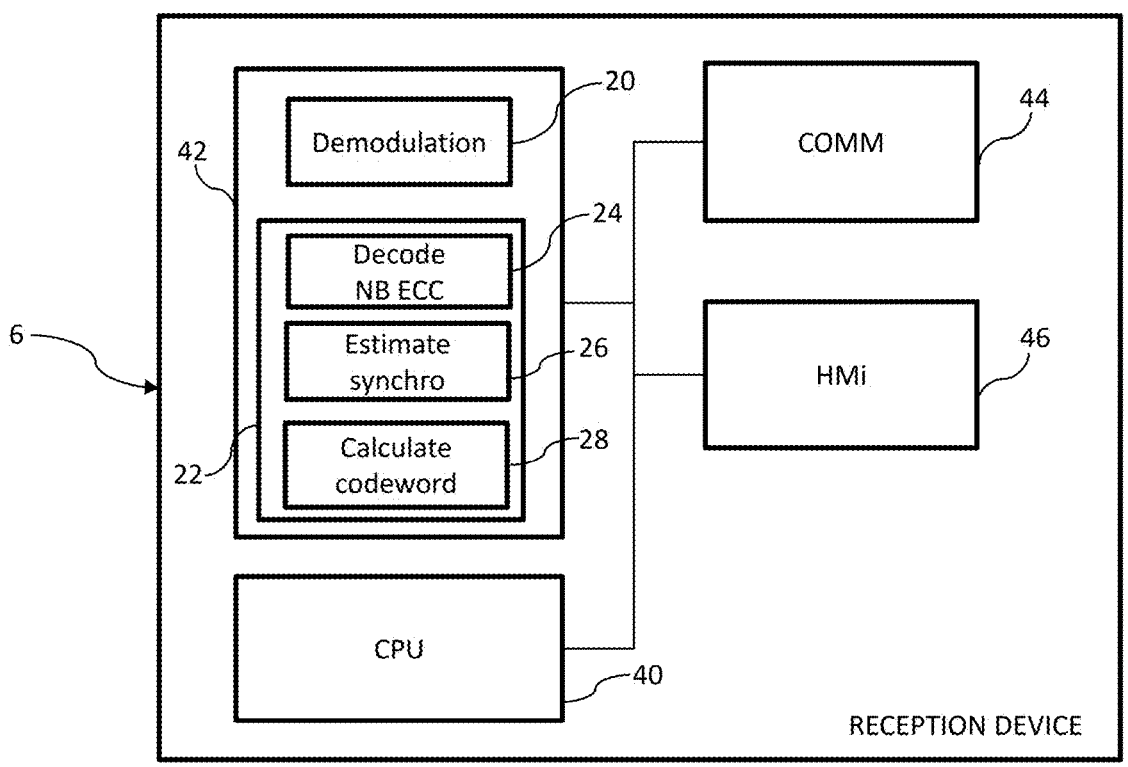
FIG. 3 schematically represents a reception device according to one embodiment.

FIG. 3 schematically represents a reception device 6 according to one embodiment. The reception device 6 is a programmable electronic device, typically a computer, and comprises a central computing unit (CPU) 40, an electronic memory 42, a communication interface 44 and a human-machine interface 66. The elements 40, 42, 44, 46 are suitable for communicating via a communication bus.

The central computing unit 40 comprises one or a plurality of processors apt to execute computer program instructions stored by the electronic memory 42 when the device 6 is powered on.

The electronic memory unit is configured for storing a demodulation module 20 and a module 22 for joint decoding and synchronization. The module 22 comprises a module 24 for decoding a non-binary error correcting code, a module 26 for estimating a synchronization shift and a module 28 for calculating the transmitted code word and the corresponding message by applying the estimated synchronization shift.

In one embodiment, the modules 20, 24, 26, 28 are produced in the form of software code, and form a computer program, including software instructions which, when implemented by a programmable electronic device, implement a reception method according to the invention.

In a variant (not shown), the modules 20, 24, 26, 28 are each embodied in the form of a programmable logic component, such as an FPGA (Field Programmable Gate Array) or a GPGPU (General-purpose processing on graphics processing), or further in the form of a dedicated integrated circuit, such as an ASIC (Application Specific Integrated Circuit).

The computer program implementing the reception method is further apt to be recorded on a computer-readable medium (not shown). The computer-readable medium is e.g. a medium apt to store the electronic instructions and to be coupled to a bus of a computer system. As an example, the readable medium is an optical disk, a magneto-optical disk, a ROM memory, a RAM memory, any type of non-volatile memory (e.g. EPROM, EEPROM, FLASH, NVRAM), a magnetic card or an optical card.

Figure 4:
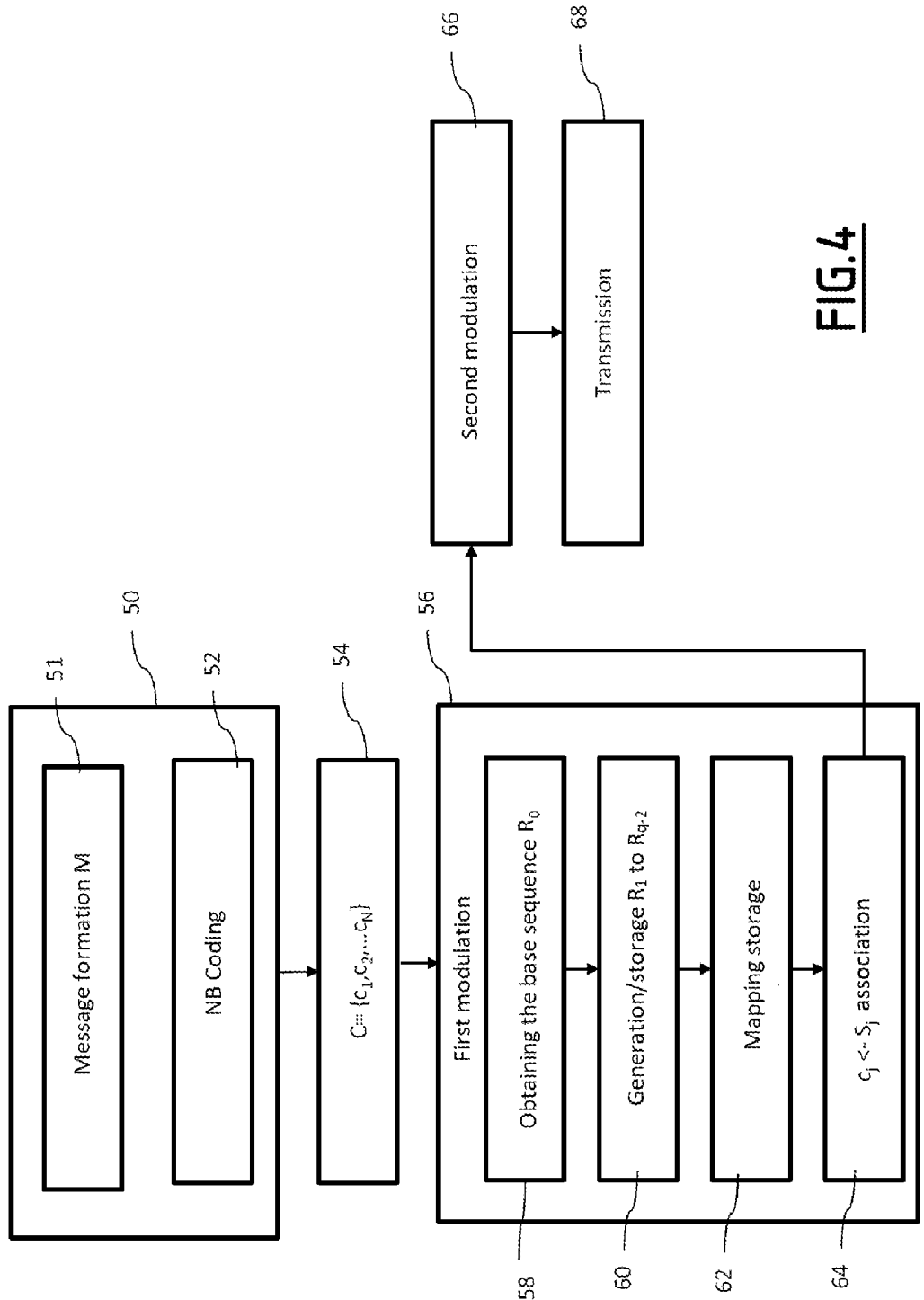
FIG. 4 is a flowchart of the main steps of a transmission method according to one embodiment.

FIG. 4 is an flowchart of the main steps of the transmission method according to one embodiment.

The method includes a step 50 of obtaining non-binary error code word symbols to be transmitted.

In one embodiment, the step 50 includes sub-steps 51 of formation of the message M to be processed and transmitted according to the description given hereinabove, and a sub-step 52 of encoding by a chosen non-binary error correcting code which can be used for obtaining p-bit coded symbols, p being an integer.

Two distinct embodiments of the sub-step 51 of formation of the message M are envisaged.

In a first embodiment, the message M comprises K−1 exploitable data symbols to be transmitted, as well as an anchoring symbol of predetermined non-zero value, placed at a predetermined position in the message (e.g. $m_1=\alpha^0$).

In a second embodiment, the message M comprises K−1 exploitable data symbols to be transmitted and a symbol, the value of which is determined as a function of the K−1 symbols of exploitable data, so that an anchoring symbol placed at a predetermined position in the code word, takes a predetermined non-zero value (e.g. $m_1=h_1^{-1}(\alpha^0-h_2m_2\ldots-h_Km_K)$, so that after the encoding step 52, $c_1=\alpha^0$ is obtained)

The non-binary error correcting code applied in the sub-step 52 is e.g. a non-binary low density parity code NB-LDPC.

The symbols obtained are part of a Galois field $GF_q$ with $q=2^p$ elements.

At the end of the step 50, a correcting code word is obtained: $C=\{c_1, \ldots, c_N\}$ (referenced by 54).

The method further comprises a step 56 of applying a first modulation, which is a modified CCSK modulation as described hereinabove, which can be used for associating each symbol with a sequence of q−1 chips among the set of sequences $\{Z, R_0, R_1, \ldots, R_{q-2}\}$ including the constant sequence Z and sequences of chips $R_u$, each sequence $R_u$ being obtained by circular shifting of a pseudo-random basic sequence $R_0$ of q−1 chips.

Optionally, the first modulation step 56 comprises sub-steps 58 to 62 as described hereinafter.

The step 56 then comprises a sub-step 58 for obtaining the basic pseudo-random sequence $R_0$.

Preferentially, such basic pseudo-random sequence is generated by a generator and stored. The sequence is e.g. generated by a linear feedback shift register of maximum length.

The step 56 further comprises a sub-step 60 for generating and storing sequences $R_1$ to $R_{q-2}$.

Step 56 also comprises a sub-step 62 of storing the mapping function μ( ) as defined by the formula [MATH 10].

In a variant, the generation of the set of sequences $R_0$ to $R_{q-2}$ and the storage of the mapping are performed prior to the implementation of the method.

Finally, the step 58 comprises a step 64 of associating a sequence of chips with each code word symbol, wherein, for each symbol $c_j$ of the code word C, the associated sequence of chips Sj is determined by applying the mapping function:

$$S_j=\mu(c_j) \qquad [\text{MATH 13}]$$

The method further comprises a step 66 of applying a second modulation, e.g. a phase modulation or an amplitude modulation.

In one embodiment, for each sequence $S_j=R_i$, in other words if the sequence $S_j$ is one of the sequences of chips obtained from the basic pseudo-random sequence $R_0$, then the BPSK modulation is applied, as well as for the constant sequence Z.

According to a variant, different from the modulation applied to the sequences of chips obtained by circular shifting of the basic pseudo-random sequence, the constant sequence is modulated to "0". In other words, there is no transmission (e.g. absence of carrier wave) during the duration of the constant sequence Z. Advantageously, the transmission power is reduced.

The second modulation 66 is followed by a step of transmission 68 of the successive carriers forming a signal X.

Advantageously, due to the covariance property defined hereinabove, in an "ideal" case, if the transmission channel 8 introduces a circular desynchronization, i.e. if the sequences of chips $(S_1, \ldots, S_N)$ associated with the symbols $(c_1, \ldots, c_N)$ of a code word C, are received at the decoder in the form $(k \circlearrowleft S_1, \ldots, k \circlearrowleft S_N)$, the implementation of the inverse association $\mu^{-1}( )$ can be used for directly obtaining the code word $C'=(\alpha^k c_1, \ldots, \alpha^k c_N)$.

The ideal case described hereinabove is purely theoretical.

In practice, the transmission channel 8 introduces a desynchronization which results in a "quasi-circular" desynchronization of the sequences $(S_1, \ldots, S_N)$. Indeed, in the event of desynchronization of k chips, only q−1−k chips of a received sequence correspond to a circular shift of the transmitted sequence of chips, the k remaining chips being in fact chips belonging to a contiguous sequence of chips. In this way it is possible to consider the received sequence as a noisy version of the sequence $(k \circlearrowleft S_1, \ldots, k \circlearrowleft S_N)$.

Thus, by decoding the received sequence, an estimation of the code word $C'=(\alpha^k c_1, \ldots, \alpha^k c_N)$, and thus of the corresponding message $M'=(\alpha^k m_1, \ldots, \alpha^k m_K)$, is obtained.

The knowledge of an anchoring symbol of predetermined value, whether same is a symbol of the transmitted code word C or of the corresponding message M, can then be further used for determining the synchronization shift k undergone by the transmitted signal, as will be explained thereafter.

It should also be noted that, in addition to correction of the synchronization shift, the decoding operation can be further used for correcting the transmission errors due to the noise present on the transmission channel.

Thus, the proposed invention makes it possible to jointly perform the synchronization and the error-correcting decoding.

Figure 5:
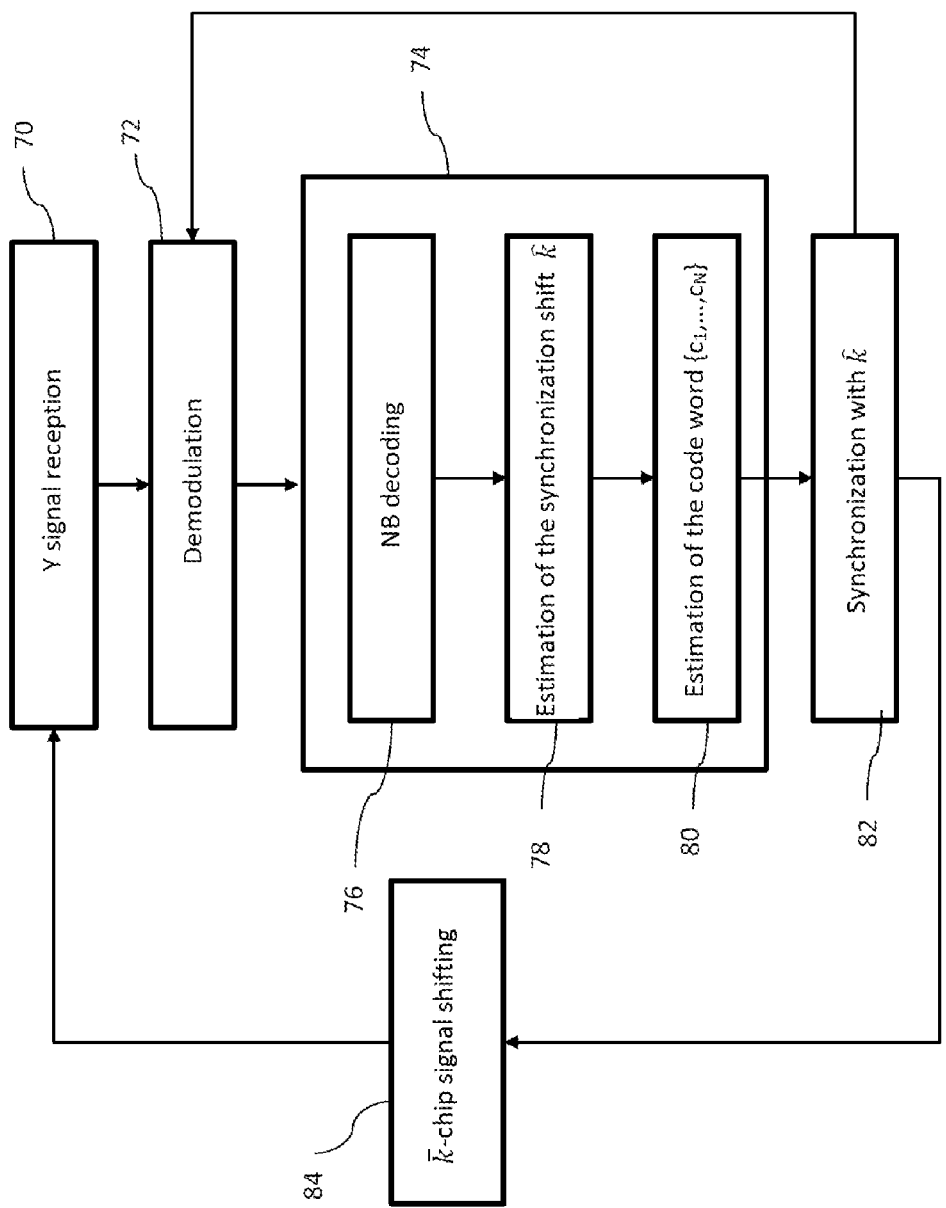
FIG. 5 is a flowchart of the main steps of reception method according to one embodiment.

FIG. 5 is a flowchart of the main steps of the reception method according to one embodiment.

The reception method includes a step 70 of receiving a signal Y, which corresponds to the signal X transmitted by the transmission method, affected by an unknown synchronization shift and corrupted by a noise, e.g. which can be modeled by Gaussian white noise.

The reception method comprises a demodulation step 72 which can be used for obtaining an estimation of the transmitted coded symbols, from the received signal Y, without any estimation of the synchronization shift.

According to various possible embodiments, the estimation can take either the form of a hard decision, i.e. determining for each code word symbol, the most likely value in $GF_q$ based on the received signal, or the form of a soft decision, i.e. determining for each symbol of the code word, a probability distribution over $GF_q$, or in an equivalent way, logarithmic likelihood values for each element of $GF_q$, depending on the signal received.

In one embodiment, the demodulation 72 applies a so-called log likelihood ratio (LLR) method of order q (q-ary LLR), known to a person skilled in the art.

In one embodiment, the calculation is performed using discrete and inverse Fourier transform operations, implemented e.g. by Fast Fourier Transforms (FFT) and Inverse Fast Fourier Transforms (IFFT).

The method then includes a joint decoding and synchronization step 74, jointly performing the decoding of the transmitted code words and the estimation of the synchronization shift k.

The step 74 includes a sub-step 76 of decoding by applying the non-binary error correcting decoding corresponding to the non-binary error correcting coding applied in the transmission method.

At the end of the step 76 a decoded word is obtained, denoted by:

$$\hat{C}'=(\hat{c}_1',\ldots,\hat{c}_N')$$ [MATH 14]

and a corresponding message, denoted by:

$$\hat{M}'=(\hat{m}_1',\ldots,\hat{m}_K')$$ [MATH 15]

The decoded word is an estimation of the transmitted code word multiplied by the primitive element α of the field $GF_q$ to the power of k, k being the synchronization shift undergone by the transmitted signal:

$$\hat{C}'=(\alpha^k c_1,\ldots,\alpha^k c_N)$$ [MATH 16]

In the same way, the decoded message is an estimation of the message M multiplied by the primitive element α of the field $GF_q$ to the power of k $$\hat{M}'=(\alpha^k m_1,\ldots,\alpha^k m_K)$$ [MATH 17]

The method then comprises a step 78 of estimating the synchronization shift k from the decoded word or message, the estimated value of the synchronization shift being denoted by $\hat{k}$.

In one embodiment, the estimation is performed knowing the predetermined position and the predetermined non-zero value of the message anchoring symbol M, introduced during the step 51 of formation of the message M.

The position symbol in first position e.g. is concerned, and the predetermined non-zero value is equal to 1, i.e., $m_1=1$ from which is deduced:

$$\hat{m}_1'=\alpha^k$$ [MATH 18]

Therefore, the estimation of the synchronization shift is calculated by the formula:

$$\hat{k}=\log_\alpha \hat{m}_1'$$ [MATH 19]

where the logarithmic function hereinabove denotes the discrete logarithm defined in the multiplicative group of the field $GF_q$.

In another embodiment, the estimation is performed knowing the predetermined position and the predetermined non-zero value of the anchoring symbol of the code word C, introduced during the step 51 of formation of the message M.

The position symbol in the first position e.g. is concerned, and the predetermined non-zero value is equal to 1, i.e., $c_1=1$ from which is deduced:

$$\hat{c}_1'=\alpha^k$$ [MATH 20]

Therefore, the estimation of the synchronization shift is calculated by the formula:

$$\hat{k}=\log_\alpha \hat{c}_1'$$ [MATH 21]

The method then includes estimating 80 the transmitted code word C and/or the corresponding message M by applying the estimated synchronization shift $\hat{k}$.

The step 80 implements a calculation consisting of dividing each symbol of the decoded word $\hat{C}'$ and/or of the message $\hat{M}'$ by the primitive element α of the field $GF_q$ to the power of $\hat{k}$.

Thus, by denoting by $\hat{C}=(\hat{c}_1,\ldots,\hat{c}_N)$ the estimation of the transmitted code word C, and by $\hat{M}=(\hat{m}_1,\ldots,\hat{m}_K)$ the estimation of the corresponding message M, during the step 80 we determine:

$$\hat{c}_i=\alpha^{-\hat{k}}\hat{c}_i', \forall i=1,\ldots,N$$

$$\hat{m}_i=\alpha^{-\hat{k}}\hat{m}_i', \forall i=1,\ldots,K$$ [MATH 22]

Optionally, if the word decoded $\hat{C}$ during the step 80 is not a code word, i.e. same is not part of the set of code words of the error correcting code implemented, the method further comprises a step 82 of synchronizing the received signal by applying the estimated synchronization shift $\hat{k}$, and the steps 72 to 80 are iterated until a stop criterion is satisfied.

The stop criterion consists e.g. of checking that the word decoded during the step 80 is a code word, or that a predetermined number of iterations has been performed.

Moreover, according to a variant, the steps 70 to 82 are applied periodically, with a period equal to a predetermined number of chips k.

Figure 6:
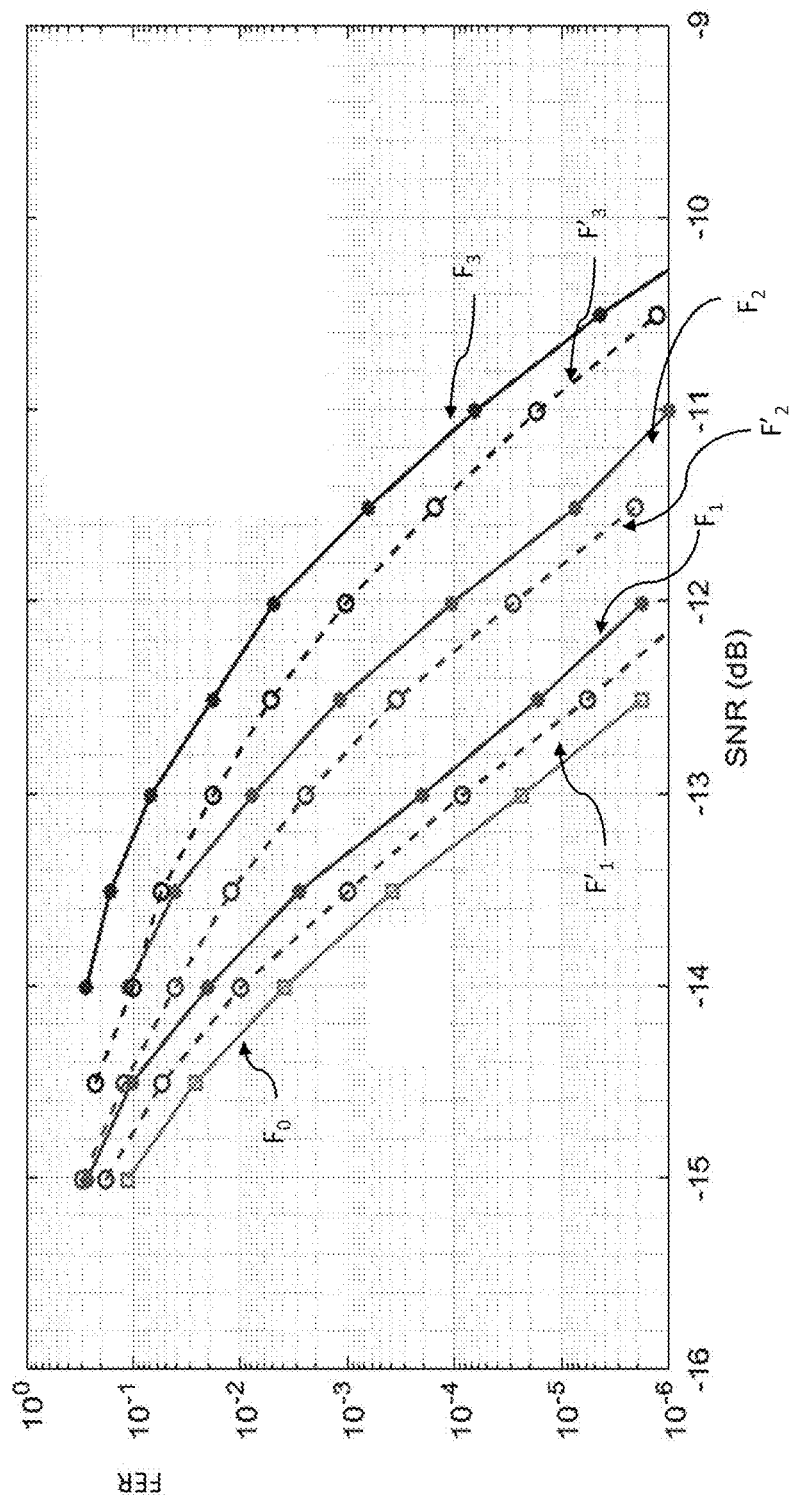
FIG. 6 is a graph with curves illustrating the error rate per reception frame for a plurality of examples of implementation.

FIG. 6 illustrates the decoding performance in a practical example wherein p=6, q=64. The non-binary error correcting code used is the NB-LDPC code on $GF_{64}$, with variable nodes of degree 2 and parity nodes of degree 3, and a yield R=1/3.

The message to be transmitted comprises 20 source symbols of $GF_{64}$ (corresponding to K×p=120 source bits), including the anchoring symbol. The code word generated by the non-binary LDPC coding contains N=60 symbols of $GF_{64}$.

The code word symbols are modulated according to the first modified CCSK modulation, so as to obtain 60 sequences of q−1=63 chips, i.e. a frame of 3780 chips. The constant sequence Z is an "all set to zero" sequence.

The BPSK modulation is applied to chip sequences, including the sequence Z, according to the modulation scheme: 0→1 and 1→−1.

The signal obtained is made noisy with a Gaussian white noise of variance $\sigma^2$ for simulating the transmission channel.

The result curves are plotted in the plane of the received frame error rate (FER) as a function of the signal-to-noise ratio SNR.

The curve $F_0$ corresponds to the case without any synchronization shift (k=0).

The curves $F_1$, $F'_1$ correspond to a synchronization shift less than or equal to 4, the decoding being repeated periodically every $\bar{k}=8$ chips. The solid line curve $F_1$ corresponds to the result after the first application of the joint decoding with the synchronization shift estimation, and the dotted line curve $F'_1$ corresponds to the result after the application of the joint decoding with the synchronization shift estimation with an additional iteration.

The curves $F_2$, $F'_2$ correspond to a synchronization shift less than or equal to 10, the decoding being repeated periodically every $\bar{k}=20$ chips, the solid line curve $F_2$, respectively, corresponds to the result after the first application of the decoding together with the synchronization shift estimation, and the dotted line curve $F'_2$ corresponds to the result after the application of the joint decoding with the synchronization shift estimation with an additional iteration.

The curves $F_3$, $F'_3$ correspond to a synchronization shift less than or equal to 15, the decoding being repeated periodically every $\bar{k}=30$ chips, the solid line curve $F_3$ corresponds to the result after the first application of the decoding together with the synchronization shift estimation, and the curve $F'_3$ dotted line corresponds to the result after the application of the joint decoding with the synchronization shift estimation with an additional iteration.

According to a variant of embodiment, the formation of the message M is done so as to "partially" determine the value of an anchoring symbol placed at a predetermined position either in the message M or in the code word C, the value belonging to a predetermined subset of $GF_q$, with a cardinal greater than 1.

It should be further noted that if the anchoring symbol takes a value in a predetermined subset of $2^a$ elements of $GF_q$, with a<p, the message M then includes (K−1)p+a data bits.

In such case, a plurality of estimations of the synchronization shift can be determined during the step 78. Specifically, an estimation of the synchronization shift can be obtained for each possible value of the anchoring symbol. It is then possible to choose one of the estimations of the synchronization shift, using e.g. a likelihood criterion, or an a priori knowledge of the interval of the synchronization shift.

When the steps 70 to 82 e.g. are applied periodically, with a period equal to a predetermined number $\bar{k}$ of chips, the synchronization shift is then deduced therefrom as a priori information $$k \in \left[-\frac{\bar{k}}{2}, +\frac{\bar{k}}{2}\right].$$

If only one of the estimations obtained falls within said interval, it will then be possible to determine accurately the value of the synchronization shift.

In all the embodiments described hereinabove, the sequence of chips Z, associated with the symbol 0 of $GF_q$, is a constant sequence formed by q−1 chips of the same value, and thus invariant to any circular shift (or circular permutation).

According to a variant of embodiment, the sequence of chips Z is invariant only to a predetermined subset of permutations corresponding to circular shifts.

In such variant, the sequence of chips Z is said to be partially invariant.

If the sequence of chips Z e.g. is invariant to permutations corresponding to circular shifts by an even number of positions, then Z will have the form:

$$Z=(z,z',z,z',\ldots) \qquad \text{[MATH 23]}$$

If the chip sequence Z is invariant to the permutations corresponding to the circular shifts by a number [of] multiple of 3 positions, then Z will have the form:

$$Z=(z,z',z'',z,z',z'',\ldots) \qquad \text{[MATH 24]}$$

In this way it is possible to apply all the steps of the invention, as described hereinabove, in particular the steps 70 to 82, considering a plurality of hypotheses on the synchronization shift, until the difference between the hypothesis considered and the true synchronization shift introduced by the channel corresponds to a permutation of the predetermined subset.

If the sequence of chips Z e.g. is invariant to the permutations corresponding to the circular shifts by an even number of positions, two hypotheses can be considered, a first hypothesis considering that the synchronization shift is even, and a second hypothesis considering that the synchronization shift is odd.

If the sequence of chips Z is invariant to the permutations corresponding to the circular shifts by a number [of] multiple of 3 positions, three hypotheses can be considered, considering that the synchronization shift is a multiple of three, a multiple of three plus one, or a multiple of three plus two, respectively.

Advantageously, the proposed method can be used for detecting the presence of a message. Advantageously, when the message is formed so that an anchoring symbol is placed at a predetermined position, the method can be further used for determining the synchronization shift, and consequently for jointly performing the synchronization and the error-correcting decoding after reception.

The detection of the presence of a message is of interest as such for certain applications.

Moreover, in the case of a transmitted message protected by a CRC (Cyclic Redundancy Check) correcting code, determining the synchronization shift can be envisaged by testing all the possible values.

The invention claimed is:

1. A method for transmitting non-binary error correcting code word symbols through a transmission channel, each code word symbol comprising p bits, p being a positive integer, and being part of a finite field $GF_q$ with a number q of elements, wherein $q=2^p$, the method including:
    a first spread spectrum modulation associating a sequence of chips with each p-bit code word symbol,
    a second modulation for modulating at least one carrier with the sequences associated with the code words, by phase or amplitude modulation, making it possible to obtain at least one modulated carrier,
    a transmission of said at least one modulated carrier forming a signal through said transmission channel,
    wherein the first modulation implements a set of q sequences comprising q−1 sequences of q−1 chips, each sequence being obtained by circular shifting of a basic pseudo-random sequence, and a partially invariant sequence, is a constant sequence consisting of q−1 chips of the same value and invariant to each circular shift of a predetermined subset of circular shifts, and wherein the first modulation further implements an association between each code word symbol and a sequence of the set of sequences wherein, said finite field $GF_q$ has a non-zero primitive element, the symbol zero being associated with said partially invariant sequence and a symbol equal to a power j of the primitive element, j being an integer comprised between 0 and q–2, being associated with a pseudo-random sequence determined by j circular shifts of the basic pseudo-random sequence.

2. The method according to claim 1, further including, prior to an application of a non-binary error correcting code, forming a message of a number K of symbols of $GF_q$, to which the non-binary error correcting coding is applied so as to generate a code word, the message being formed in such a way that a symbol called an anchoring symbol, with a value belonging to a predetermined subset of $GF_q$, is placed at a predetermined position in the message or in said code word.

3. The method according to claim 2, wherein said predetermined subset comprises a single predetermined non-zero value, and said anchoring symbol takes said predetermined non-zero value.

4. The method according to claim 3, wherein during the step of forming the message, said anchoring symbol is placed at said predetermined position in the message.

5. The method according to claim 3, wherein the formation of the message comprises a determination of a symbol of said message as a function of K–1 other symbols of the message, the code word obtained after encoding comprising said anchoring symbol at said predetermined position.

6. Transmission method according to claim 1, wherein the first modulation comprises the generation of the basic pseudo-random sequence by a linear feedback shift register of maximum length.

7. The transmission method according to claim 1, wherein the second modulation is a phase or an amplitude modulation of the carrier.

8. The transmission method according to claim 1, wherein the second modulation used for the partially invariant sequence is different from the second modulation used by the sequences obtained by circular shifting of the basic pseudo-random sequence.

9. The transmission method according to claim 8, wherein the second modulation includes an absence of carrier wave for the partially invariant sequence and a phase modulation for the sequences obtained by circular shifting of the basic pseudo-random sequence.

10. A method for receiving a received signal, said received signal coming from a signal transmitted by a transmission method according to claim 1, said transmitted signal including transmitted error correcting code word symbols, the reception method comprising steps of:
  demodulating the received signal, which can be used for obtaining an estimation of the coded symbols transmitted from the received signal,
  a joint decoding and synchronization, comprising:
    a decoding for determining a decoded word and/or a corresponding decoded message from the estimations of the coded symbols, as provided by the demodulation step, said decoded word providing an estimation of the transmitted code word multiplied by the primitive element of the finite field $GF_q$ raised to a power equal to a synchronization shift,
    an estimation of said synchronization shift starting from an anchoring symbol at a predetermined position in the decoded word or in the corresponding decoded message.

11. The reception method according to claim 10, wherein the step s of demodulation and of joint decoding and synchronization are periodically repeated, shifting the received signal by a predetermined number of chips.

12. The reception method according to claim 10, further comprising an estimation of the transmitted code word by dividing the symbols of the decoded word and/or of the decoded message by the primitive element of the finite field raised to the power equal to the estimated synchronization shift.

13. The reception method according to claim 12, further comprising, when the estimation of the transmitted code word does cannot be used for obtaining a code word, a synchronization by applying the estimated synchronization shift and an iteration of the decoding steps, of estimation of the synchronization shift until a stop criterion is satisfied.

14. A device for transmitting non-binary error correcting code word symbols through a transmission channel, each code word symbol comprising p bits, p being a positive integer, and being part of a finite field $GF_q$ with a number q of elements, wherein $q=2^p$, the transmission device being configured for implementing:
  a first spread spectrum modulation module associating a sequence of chips with each p-bit code word symbol,
  a second modulation module configured for modulating of at least one carrier with the sequences associated with the code words, by phase or amplitude modulation, which can be used for obtaining at least one modulated carrier,
  a module for transmitting said at least one modulated carrier forming a signal, through said transmission channel,
  wherein the first modulation module is configured for implementing a set of q sequences comprising q–1 sequences of q–1 chips, each sequence being obtained by circular shifting of a basic pseudo-random sequence, and a partially invariant sequence, is a constant sequence consisting of q–1 chips of the same value and invariant to each circular shift of a predetermined subset of circular shifts,
  and wherein the first modulation module is further configured for implementing an association between each code word symbol and a sequence of the set of sequences wherein, said finite field $GF_q$ having a non-zero primitive element, the symbol zero being associated with the partially invariant sequence and a symbol equal to a power j of the primitive element, j being an integer comprised between 0 and q–2, is associated with a pseudo-random sequence determined by j circular shifts of the basic pseudo-random sequence.

15. A device for receiving a received signal, said received signal being derived from a signal transmitted by a transmission device according to claim 14, said transmitted signal including transmitted error correcting code word symbols, the reception device being configured for implementing:
  a module for demodulating the received signal, which can be used for obtaining an estimation of the coded symbols transmitted from the received signal,
  a module for joint decoding and synchronization, comprising:
    a decoding module for determining a decoded word and/or a corresponding decoded message from the estimations of the coded symbols, as provided by the demodulation step, said decoded word providing an estimation of the transmitted code word multiplied by the primitive element of the finite field $GF_q$ raised to a power equal to a synchronization shift, a module for estimating said synchronization shift from an anchoring symbol at a predetermined position in the decoded word or in the corresponding decoded message.

\* \* \* \* \*